US012503790B2

(12) United States Patent
Wu et al.

(10) Patent No.: US 12,503,790 B2
(45) **Date of Patent: *Dec. 23, 2025**

(54) SYSTEMS AND METHODS FOR PRODUCING A SINGLE CRYSTAL SILICON INGOT USING A VAPORIZED DOPANT

(71) Applicant: GlobalWafers Co., Ltd., Hsinchu (TW)

(72) Inventors: Yu-Chiao Wu, Frontenac, MO (US); William Lynn Luter, St. Charles, MO (US); Richard J. Phillips, St. Peters, MO (US); James Dean Eoff, Montgomery City, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/673,020

(22) Filed: May 23, 2024

(65) Prior Publication Data

US 2024/0309541 A1 Sep. 19, 2024

Related U.S. Application Data

(60) Division of application No. 18/464,790, filed on Sep. 11, 2023, which is a continuation of application No. (Continued)

(51) Int. Cl.
*C30B 15/04* (2006.01)
*C30B 15/14* (2006.01)
*C30B 29/06* (2006.01)

(52) U.S. Cl.
CPC .............. *C30B 15/04* (2013.01); *C30B 15/14* (2013.01); *C30B 29/06* (2013.01); *Y10T 117/1032* (2015.01); *Y10T 117/1056* (2015.01)

(58) Field of Classification Search
CPC ......... C30B 15/04; C30B 15/14; C30B 29/06; Y10T 117/1032; Y10T 117/1056
See application file for complete search history.

(56) References Cited

U.S. PATENT DOCUMENTS 5,314,667 A * 5/1994 Lim ........................ C30B 15/02 117/214
6,309,974 B1 10/2001 Strack et al.
(Continued)

FOREIGN PATENT DOCUMENTS

CN 1600905 A * 3/2005
CN 101681805 A 3/2010
(Continued)

OTHER PUBLICATIONS

International Search Report and Written Opinion issued for PCT/US2021/065810, dated Apr. 14, 2022, pp. 1-19.

*Primary Examiner* — Hua Qi
(74) *Attorney, Agent, or Firm* — Armstrong Teasdale LLP

(57) ABSTRACT

A method for producing a single crystal silicon ingot includes adding polycrystalline silicon to a crucible disposed within a chamber defined by a housing of an ingot puller apparatus, maintaining the chamber at a first pressure, heating the chamber using radiant heat to melt the polycrystalline silicon and form a silicon melt in the crucible, pulling a single crystal silicon ingot from the silicon melt, channeling a liquid dopant at a second pressure greater than the first pressure into a feed tube positioned in the chamber, vaporizing the liquid dopant into a vaporized dopant by flash evaporation at the first pressure within the feed tube, and directing the vaporized dopant from the feed tube toward a surface of the silicon melt to cause the vaporized dopant to enter the silicon melt as a dopant while pulling the single crystal silicon ingot from the silicon melt.

16 Claims, 10 Drawing Sheets

Related U.S. Application Data

17/139,367, filed on Dec. 31, 2020, now Pat. No. 11,795,569.

(56) References Cited

U.S. PATENT DOCUMENTS

| | | | | |
|---|---|---|---|---|
| 2010/0132829 | A1 | 6/2010 | Javidi et al. | |
| 2010/0151667 | A1 | 6/2010 | Narushima et al. | |
| 2010/0175612 | A1 | 7/2010 | Narushima et al. | |
| 2010/0294999 | A1* | 11/2010 | Narushima | C30B 15/04 117/214 |
| 2014/0163913 | A1 | 6/2014 | Dubois et al. | |
| 2014/0167731 | A1 | 6/2014 | Dubois et al. | |
| 2015/0107509 | A1 | 4/2015 | Fukuda | |
| 2015/0349066 | A1 | 12/2015 | Caspary et al. | |
| 2016/0017513 | A1 | 1/2016 | Haringer et al. | |
| 2016/0130722 | A1 | 5/2016 | Caspary et al. | |
| 2016/0298259 | A1 | 10/2016 | Dell'Amico | |
| 2020/0048789 | A1 | 2/2020 | Soeta et al. | |

FOREIGN PATENT DOCUMENTS

| | | | |
|---|---|---|---|
| CN | 106400106 | A | 2/2017 |
| JP | 2002128591 | A | 5/2002 |
| JP | 2002226295 | A | 8/2002 |
| JP | 2008266093 | A | 11/2008 |
| JP | 2009215117 | A | 9/2009 |
| JP | 4367213 | B2 | 11/2009 |
| JP | 2011132043 | A | 7/2011 |
| JP | 2016060667 | A | 4/2016 |
| WO | 2001086033 | A1 | 11/2001 |
| WO | 2006003782 | A1 | 1/2006 |
| WO | 2016031164 | A1 | 3/2016 |
| WO | 2020263455 | A1 | 12/2020 |

* cited by examiner

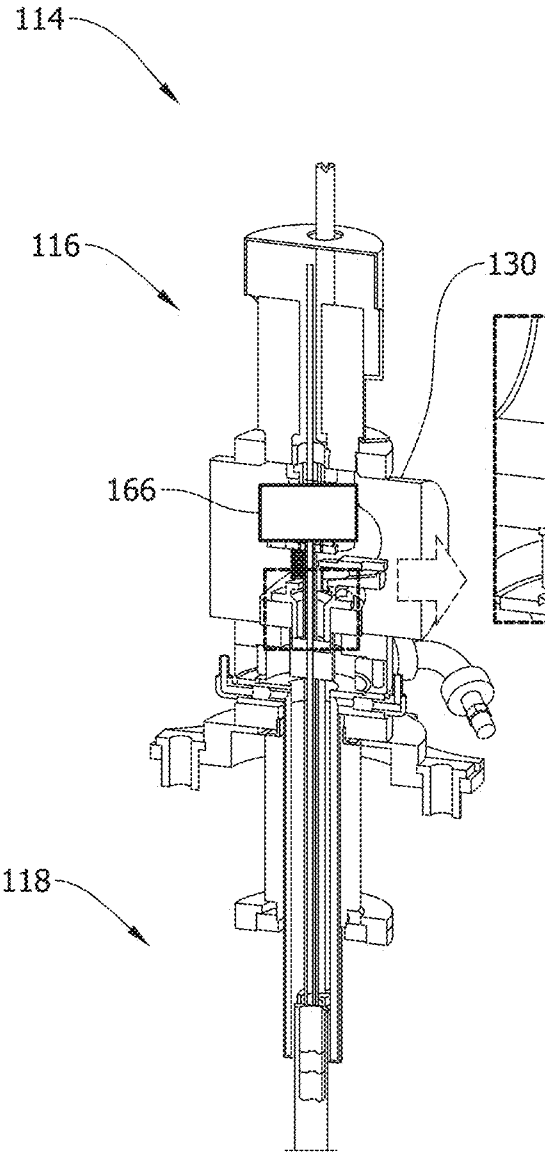
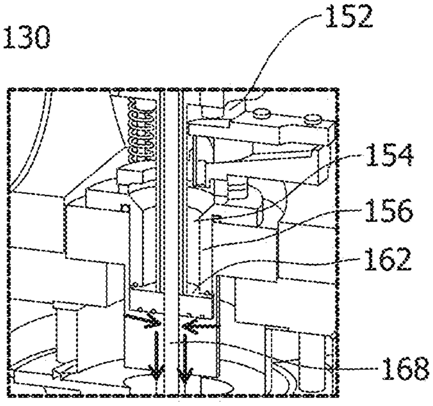
FIG. 5B
FIG. 5A

206

SYSTEMS AND METHODS FOR PRODUCING A SINGLE CRYSTAL SILICON INGOT USING A VAPORIZED DOPANT

CROSS-REFERENCE TO RELATED APPLICATION

This application is a divisional application of and claims priority to U.S. patent application Ser. No. 18/464,790, filed on Sep. 11, 2023, which is a continuation of and claims priority to U.S. patent application Ser. No. 17/139,367, filed on Dec. 31, 2020, the disclosures of which are incorporated by reference in their entirety.

FIELD

The field relates to systems and methods for producing a single crystal silicon ingot using a vaporized dopant.

BACKGROUND

In high resistivity silicon wafer applications, the resistivity of the single crystal silicon ingot from which the wafers are sliced may be controlled by addition of various dopants to the melt. The dopants may be used to compensate for various impurities (e.g., boron or phosphorous) in the source of polycrystalline silicon used to form a melt from which the silicon ingot is withdrawn.

When one or more dopants are added to achieve a target resistivity in the ingot, certain dopants and/or impurities may accumulate in the melt due to differences in the segregation coefficients of the compounds. For example, boron has a segregation coefficient of about 0.8 which allows boron to be readily taken up into the growing ingot. Phosphorous has a segregation coefficient of about 0.35 which causes phosphorous to accumulate in the melt relative to boron which is taken up more readily. Accordingly, as the ingot grows and the melt is depleted, phosphorous accumulates in the melt altering the resistivity of the growing ingot. This can cause the resistivity to decrease and fall out of customer specifications and/or for a type-change to occur in the ingot.

A need exists for methods for counter-doping a silicon melt during ingot growth to increase the length of the ingot that remains within customer specifications. A need also exists for doping methods that allow for use of dopant source materials that are readily available and/or relatively inexpensive and that allow the melt to be doped with relative ease. Further, an ingot puller apparatus that allows a liquid-phase dopant to be used as the source of dopant is needed.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

In one aspect, an ingot puller apparatus for producing a doped single crystal silicon ingot includes a housing defining a chamber, a crucible disposed within the chamber, and a dopant injector extending into the housing. The dopant injector includes a delivery module attached to and extending through the housing into the chamber. The delivery module includes a dopant injection tube positioned within the chamber and a vaporization cup positioned within the dopant injection tube and the chamber. The second valve selectively channels the liquid dopant into the vaporization cup and the vaporization cup vaporizes the liquid dopant into a vaporized dopant.

In another aspect, an ingot puller apparatus for producing a doped single crystal silicon ingot includes a housing defining a chamber, a crucible disposed within the chamber, and a dopant injector extending into the housing. The dopant injector includes an injection module attached to an outer surface of the housing. The injection module includes a first reservoir for containing a liquid dopant, a second reservoir for containing the liquid dopant, a first valve for selectively channeling the liquid dopant from the first reservoir to the second reservoir, and a second valve for selectively channeling the liquid dopant from the second reservoir to the chamber. The dopant injector also includes a delivery module attached to the injection module and extending through the housing into the chamber. The second valve selectively channels the liquid dopant into the delivery module and the delivery module vaporizes the liquid dopant into a vaporized dopant.

In yet another aspect, an ingot puller apparatus for producing a doped single crystal silicon ingot includes a housing defining a chamber, a crucible disposed within the chamber, and a dopant injector extending into the housing. The dopant injector includes an injection module attached to an outer surface of the housing. The injection module includes a first reservoir for containing a liquid dopant, a second reservoir for containing the liquid dopant, a first valve for selectively channeling the liquid dopant from the first reservoir to the second reservoir, and a second valve for selectively channeling the liquid dopant from the second reservoir to the chamber. The dopant injector also includes a delivery module attached to the injection module and extending through the housing into the chamber. The delivery module includes a dopant injection tube positioned within the chamber and a vaporization cup positioned within the dopant injection tube and the chamber. The second valve selectively channels the liquid dopant into the vaporization cup and the vaporization cup vaporizes the liquid dopant into a vaporized dopant.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

FIG. 5A is a cross-section perspective view of the dopant injector shown in FIG. 1.

FIG. 5B is a detailed cross-section perspective view of the dopant chamber shown in FIG. 5A.

Corresponding reference characters indicate corresponding parts throughout the drawings.

DETAILED DESCRIPTION

An example ingot puller apparatus 100 is generally shown in FIGS. 1-8. The apparatus 100 of FIGS. 1-8 may be used to counter-dope or dope the ingot with a vaporized boron dopant as in the method described herein or may be used with other liquid-phase dopants that may be vaporized below the melting point of silicon (about 1414° C.) in either the native form, or a hydrated form, or in a compound that is non-contaminating to the crystal growth process.

Figure 1:
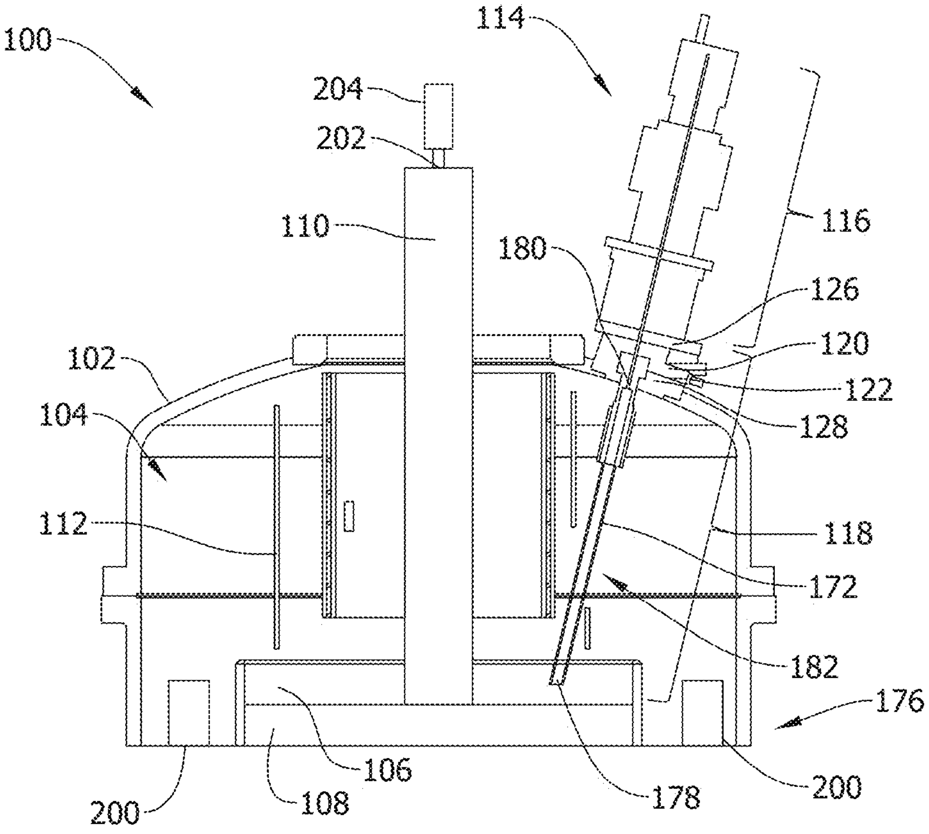
FIG. 1 is a partial cross-section side view of an embodiment of an ingot puller apparatus having a dopant injector.

Referring now to FIG. 1, the ingot puller apparatus 100 includes an ingot puller outer housing 102 that defines an ingot puller inner chamber 104 within the housing 102. A crucible 106 is disposed within the ingot puller inner chamber 104. The crucible 106 contains the silicon melt 108 from which a silicon ingot 110 is pulled. The ingot 110 is shrouded by a heat shield 112.

The ingot puller apparatus 100 includes a dopant injector 114 for injecting liquid dopant into the ingot puller apparatus as the ingot 110 is pulled from the silicon melt 108. The dopant injector 114 enables the silicon melt 108 to be counter-doped with a liquid dopant multiple times as the ingot 110 is pulled from the melt, increasing the resistivity of the ingot, increasing the portion of the ingot that is within customer specifications (e.g., high resistivity), and increasing the efficiency of the ingot puller apparatus.

The dopant injector 114 includes an injection module 116, a delivery module 118, and a first flange 120. The injection module 116 and the delivery module 118 are each attached to the first flange 120, and the flange attaches the injection module and the delivery module to the housing 102. Specifically, the housing 102 defines a dopant injector opening 122, and the first flange 120 is attached to the housing such that the flange covers the dopant injector opening.

The injection module 116 is attached to a first side 124 of the first flange 120 such that the injection module is positioned outside the chamber 104. The delivery module 118 is attached to a second side 126 of the first flange 120 such that the delivery module is positioned within the chamber 104. The injection module 116 receives dopant and channels the dopant to the delivery module 118, and the delivery module receives dopant from the injection module and injects the dopant into the chamber 104 as described herein. In this embodiment, the injection module 116 receives a liquid dopant, and the delivery module 118 vaporizes the liquid dopant within the chamber 104 as described herein.

Figure 2:
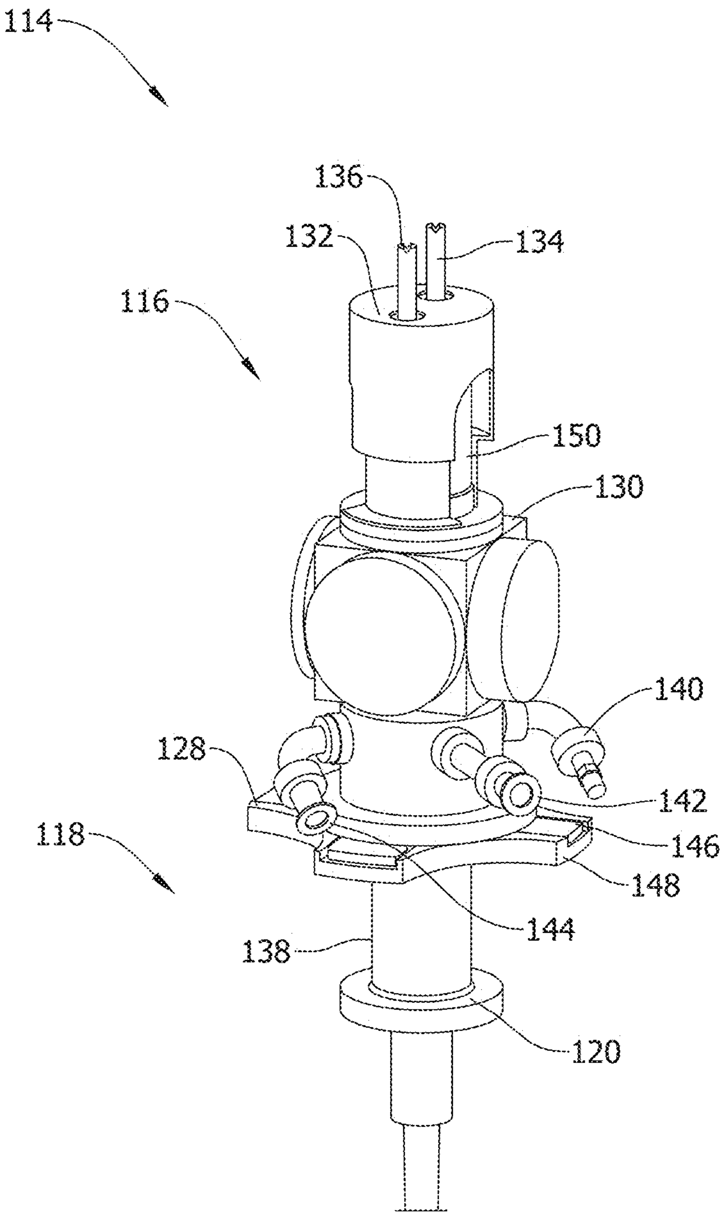
FIG. 2 is a perspective view of the dopant injector shown in FIG. 1.

As shown in FIG. 2, the injection module 116 includes a second flange 128, a doping chamber 130 attached to the second flange 128, an actuation mechanism 132 positioned on top of the doping chamber, cooling fluid conduits 134 and 136 for channeling cooling fluid to the dopant injector 114, a bellows 138 attached to the first flange 120 and the second flange 128, and ports 140, 142, and 144 for channeling material into and out of the dopant injector. The doping chamber 130 is attached to a first side 146 of the second flange 128, the bellows 138 is attached to a second side 148 of the second flange 128 and the first side 124 of the first flange 120, and the ports 140, 142, and 144 are attached to and extend from the doping chamber. The bellows 138 enables the injection module 116 to be positioned within the ingot puller inner chamber 104 proximate the silicon melt 108. Specifically, the bellows 138 enables the injection module 116 to be moved vertically relative to the silicon melt 108.

The cooling fluid conduits 134 and 136 include a cooling fluid supply 134 and a cooling fluid return 136. The cooling fluid conduits 134 and 136 extend through the actuation mechanism 132 and into the doping chamber 130. The actuation mechanism 132 includes air cylinders 150 for actuating valves within the dopant injector 114 as described herein. The ports 140, 142, and 144 include an inert gas port 140 for supplying an inert gas to the dopant injector 114, a pressure sensor port 142 for measuring a pressure of the doping chamber 130, and a vacuum port 144 for generating a vacuum within the doping chamber.

Figure 3:
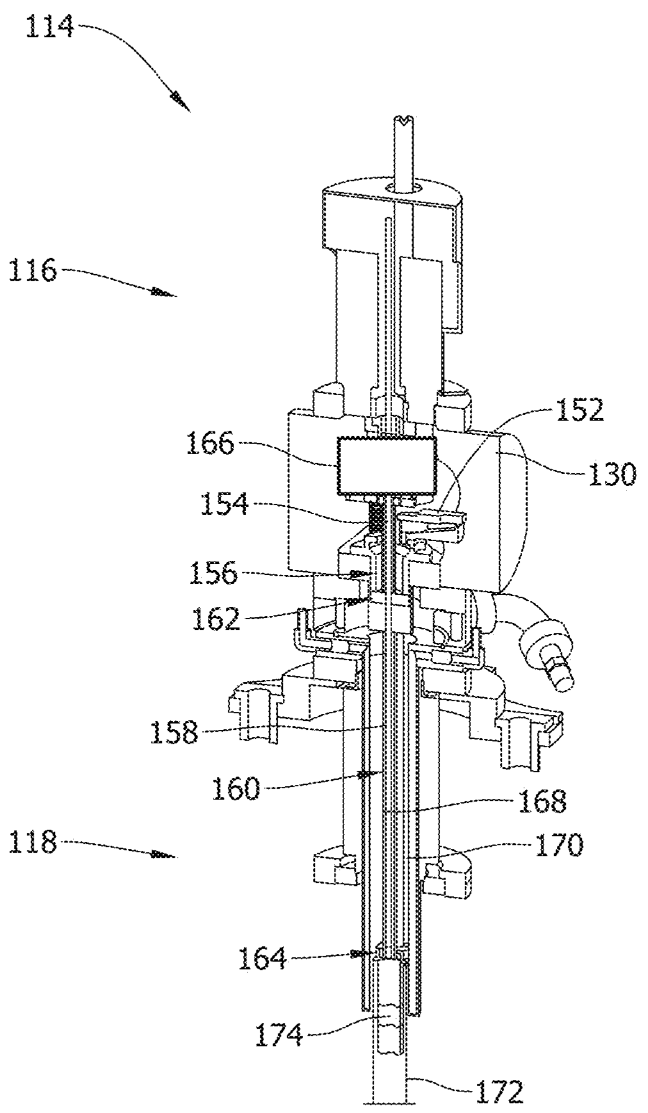
FIG. 3 is a cross-section perspective view of the dopant injector shown in FIG. 1.
Figures 4A, 4B:
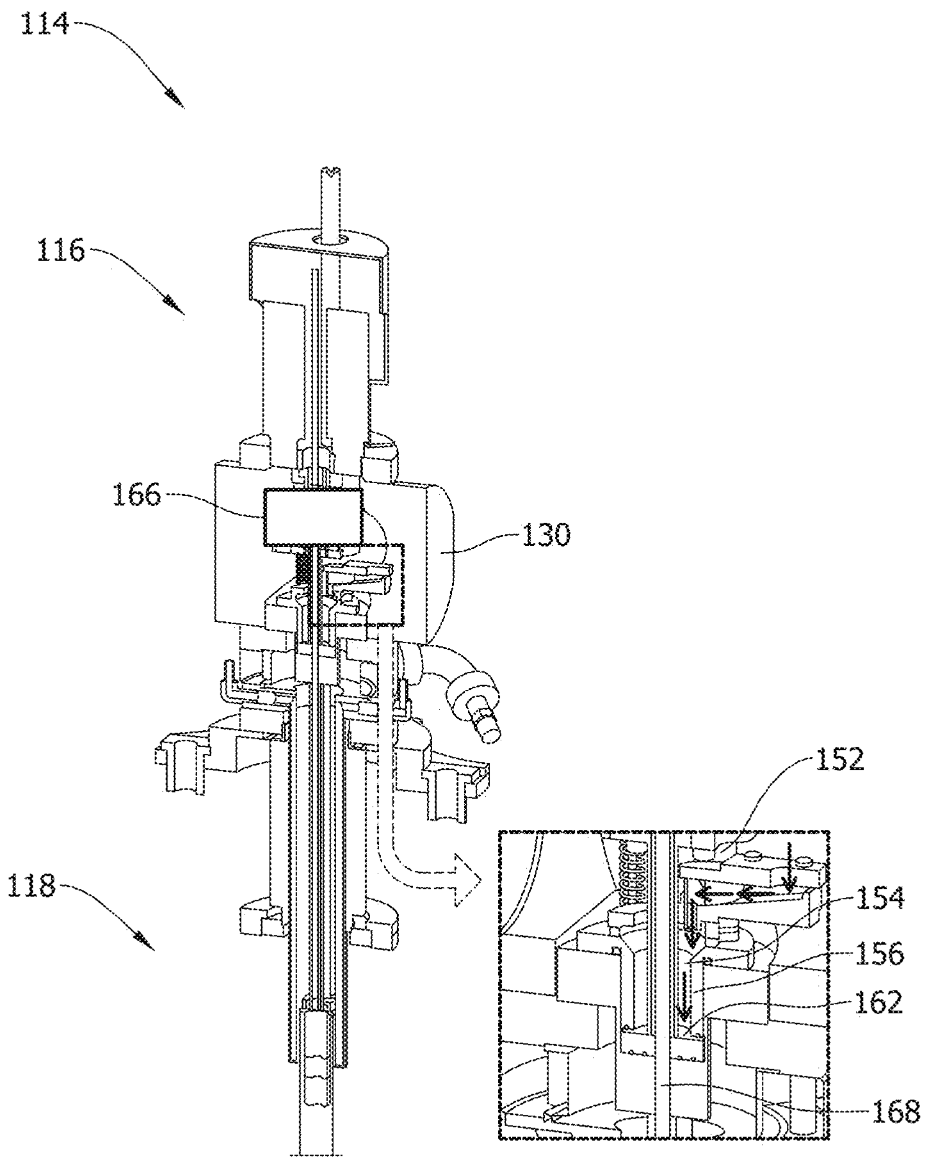
FIG. 4A is a cross-section perspective view of the dopant injector shown in FIG. 1.
FIG. 4B is a detailed cross-section perspective view of the dopant chamber shown in FIG. 4A.
Figures 6A, 6B:
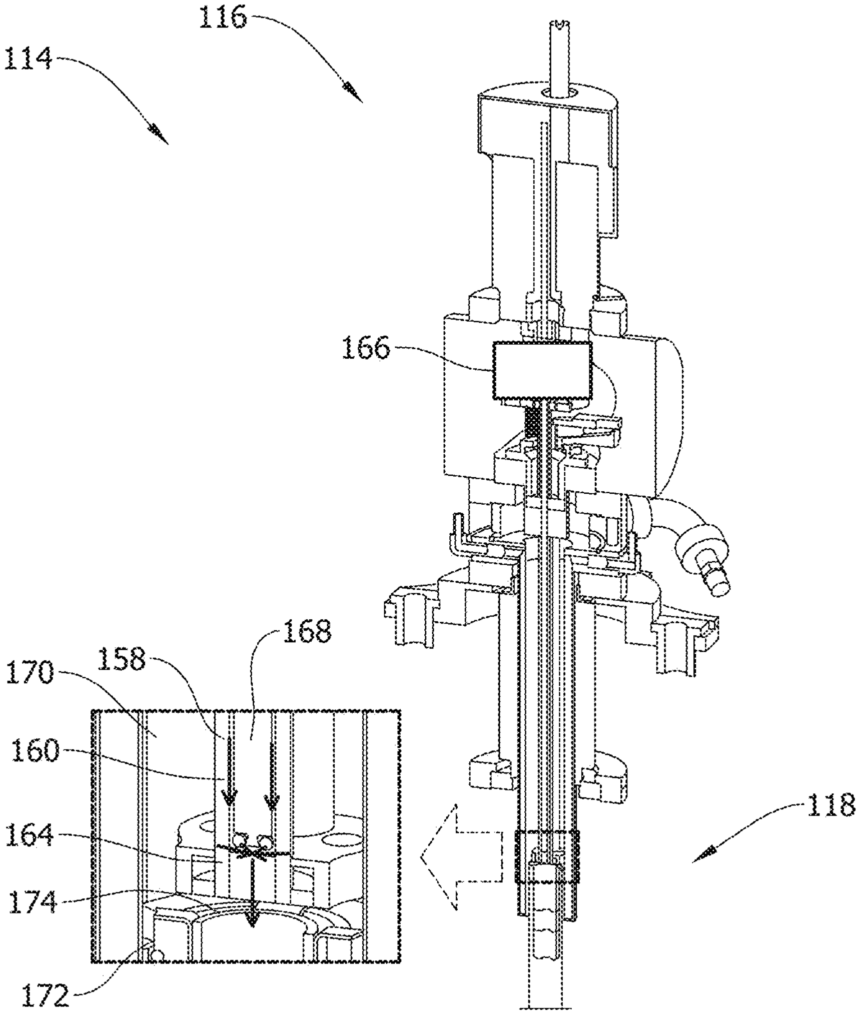
FIG. 6A is a cross-section perspective view of the dopant injector shown in FIG. 1.
FIG. 6B is a detailed cross-section perspective view of the delivery module shown in FIG. 6A.
Figure 7:
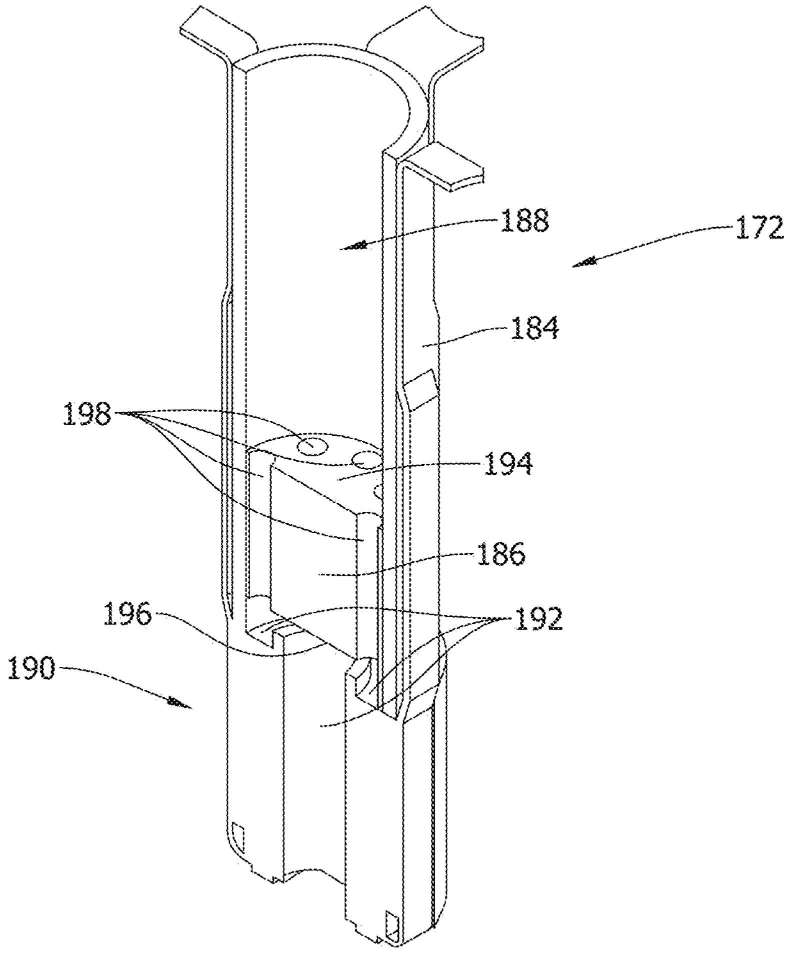
FIG. 7 is a cross-section perspective view of the vaporization cup shown in FIG. 3.

As shown in FIG. 3, the injection module 116 also includes a dopant addition tube 152, a first reservoir tube 154 defining a first reservoir 156, a second reservoir tube 158 partially defining a second reservoir 160, a first valve 162, a second valve 164, an actuator 166, an actuation shaft 168, and a cooling jacket 170. The dopant addition tube 152, the first reservoir tube 154, the first reservoir 156, and the first valve 162 are all positioned within the doping chamber 130. The second reservoir tube 158, the second reservoir 160, the actuation shaft 168, and the cooling jacket 170 all extend from the doping chamber 130. The second reservoir tube 158 circumscribes the actuation shaft 168 to define the second reservoir 160 therebetween, and the cooling jacket 170 circumscribes the second reservoir tube 158.

The dopant addition tube 152 is coupled to the first reservoir 156, and the first valve 162 is selectively actuated by the actuation shaft 168 to maintain or release liquid dopant within the first reservoir. The dopant addition tube 152 receives liquid dopant and channels the liquid dopant to the first reservoir 156. The first valve 162 is closed and maintains the liquid dopant within the first reservoir 156. Upon actuation by the actuation shaft 168, the first valve 162 opens and channels the liquid dopant into the second reservoir 160 as described herein.

The first reservoir 156 is coupled to the second reservoir 160, and the first valve 162 is selectively actuated by the actuation shaft 168 to release liquid dopant within the first reservoir to the second reservoir. The second reservoir 160 receives liquid dopant and channels the liquid dopant to the delivery module 118. The second valve 164 is closed and maintains the liquid dopant within the second reservoir 160. Upon actuation by the actuation shaft 168, the second valve 164 opens and channels the liquid dopant into the delivery module 118 as described herein. The cooling jacket 170 receives a cooling fluid from the cooling fluid supply 134 and returns the cooling fluid to the cooling fluid return 136. The cooling fluid cools the injection module 116 to prevent the injection module from overheating.

The ingot puller inner chamber 104 is maintained at a first pressure, and the doping chamber 130 is maintained at a second pressure greater than the first pressure. Specifically, the first pressure of the ingot puller inner chamber 104 is maintained at a vacuum, and the second pressure of the doping chamber 130 is maintained at atmospheric pressure such that the liquid dopant is also maintained at atmospheric pressure. In alternative embodiments, the first pressure of the ingot puller inner chamber 104 is maintained at a pressure below atmospheric pressure, and the second pressure of the doping chamber 130 is maintained at a pressure above the first pressure. Accordingly, the liquid dopant is maintained at the second pressure (atmospheric pressure) until the liquid dopant is injected into the ingot puller inner chamber 104 where the pressure of the liquid dopant is reduced to the first pressure (a vacuum).

The actuator 166 is positioned within the doping chamber 130 and is coupled to the air cylinders 150 and the actuation shaft 168. The air cylinders 150 actuate the actuator 166, and the actuator 166 actuates the first valve 162 and the actuation shaft 168. The actuation shaft 168 actuates the second valve 164. More specifically, in the illustrated embodiment, the actuator 166 is a linear actuator that translates the first valve 162 and the shaft 168 linearly to translate open the first valve and to translate the second valve 164 linearly to open the second valve. In alternative embodiments, the actuation shaft 168 is coupled to both the first valve 162 and the second valve 164 and actuates both the first valve and the second valve. In some embodiments, the actuation shaft 168 independently actuates the first valve 162 and the second valve 164. In alternative embodiments, the actuation shaft 168 actuates the first valve 162 and the second valve 164 simultaneously. For example, the actuation shaft 168 may actuate the first valve 162 and the second valve 164 simultaneously such that the first valve 162 is closed when the second valve 164 is open and the first valve 162 is open when the second valve 164 is closed in order to maintain the first pressure within the ingot puller inner chamber 104.

The delivery module 118 includes a feed tube 172 and a vaporization cup 174 positioned within the feed tube. The feed tube 172 is positioned within the ingot puller inner chamber 104 and channels vaporized dopant to the silicon melt 108. Specifically, the vaporization cup 174 is heated by radiant heat from within the ingot puller inner chamber 104 and receives the liquid dopant from the second reservoir 160. The ingot puller apparatus 100 includes a heating system 176 that melts the silicon melt 108 and radiates heat into the ingot puller inner chamber 104. The liquid dopant is vaporized into a vaporized dopant within the ingot puller inner chamber 104 where the liquid dopant is vaporized by flash evaporation by heating the liquid dopant with the vaporization cup 174 and reducing the pressure of the liquid dopant from the second pressure to the first pressure by injecting the liquid dopant into the ingot puller inner chamber 104.

The feed tube 172 has a distal end 178 furthest from the ingot puller outer housing 102 and a proximal end 180 nearest the ingot puller outer housing. A feed tube axis A extends through the distal end 178 and the proximal end 180 of the feed tube 172. The feed tube 172 may be made of quartz or other suitable materials.

The feed tube 172 is moveable within the ingot puller inner chamber 104 along the feed tube axis A. The feed tube 172 may be lowered into the ingot puller inner chamber 104 toward the silicon melt 108. Specifically, the feed tube 172 is attached to the cooling jacket 170, and the cooling jacket is attached to the doping chamber 130. The bellows 138 enables the doping chamber 130, the cooling jacket 170, and the feed tube 172 to move along the feed tube axis A toward and away from the silicon melt 108. By moving the doping chamber 130, the cooling jacket 170, and the feed tube 172, the distal end 178 of the feed tube 172 moves between a raised position in which the distal end positioned away from the silicon melt 108 and a lowered position in which the distal end is positioned proximate the surface of the silicon melt 108. The heat shield 112 may include a channel 182 formed therein to provide a pathway for the feed tube 172 to approach the silicon melt 108.

In the lowered position of the feed tube 172, the vaporized dopant travels down the feed tube where it is directed to the surface of the silicon melt 108. The vaporized dopant passes through the distal end 178 of the feed tube 172 to contact the silicon melt 108 to cause the silicon melt to be doped and/or counter doped. As the doping chamber 130, the cooling jacket 170, and the feed tube 172 are moved from the raised position to the lower position, the distance between the vaporization cup 174 and the silicon melt 108 and the heating system 176 may be changed (e.g., by an operator).

The vaporization cup 174 includes a receiver 184 and a vaporization plug 186 positioned within the receiver and divides the receiver into a liquid reception portion 188 and a vapor channel portion 190. The receiver 184 and the vaporization plug 186 define the liquid reception portion 188, and the receiver 184 defines channels 192 that channel vaporized dopant from the liquid reception portion to the feed tube 172. The vaporization plug 186 has a first end 194 and a second end 196 and defines vaporization channels 198 extending from the first end to the second end that channel vaporized dopant from the liquid reception portion 188 to the vapor channel portion 190.

Excess heat from the heating system 176 heats the vaporization plug 186, and the second valve 164 channels the liquid dopant from the second reservoir 160 into the liquid reception portion 188 and onto the vaporization plug. The vaporization plug 186 vaporizes the liquid dopant into vaporized dopant by flash evaporation by heating the liquid dopant with the vaporization plug 186 and reducing the pressure of the liquid dopant from the second pressure to the first pressure by injecting the liquid dopant into the liquid reception portion 188. The vaporization channels 198 channel the vaporized dopant into the channels 192 of the vapor channel portion 190 which channel the vaporized dopant into the feed tube 172 and to the silicon melt 108. Additionally, a process gas (e.g., argon) may be circulated through the doping chamber 130 through the inert gas port 140 for channeling the vaporized dopant through the vaporization cup 174 and the feed tube 172.

The pressure sensor port 142 enables measurement of the pressure within the ingot puller inner chamber 104. The vacuum port 144 enables pump-down and leak testing. The cooling jacket 170 cools the injection module 116 to prevent the injection module from overheating.

Figure 8:
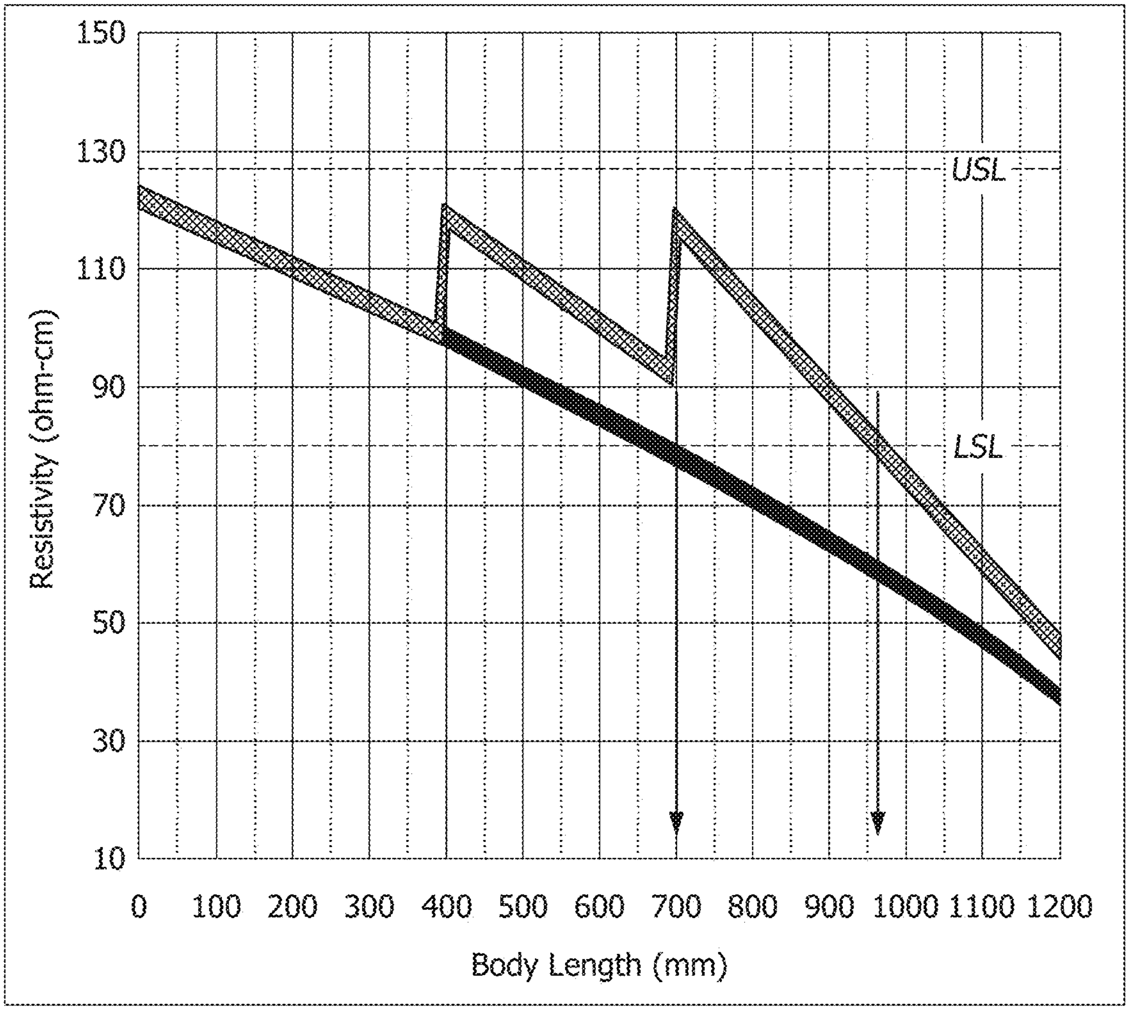
FIG. 8 is a graph of ingot resistivity as a function of ingot length.
Figure 9:
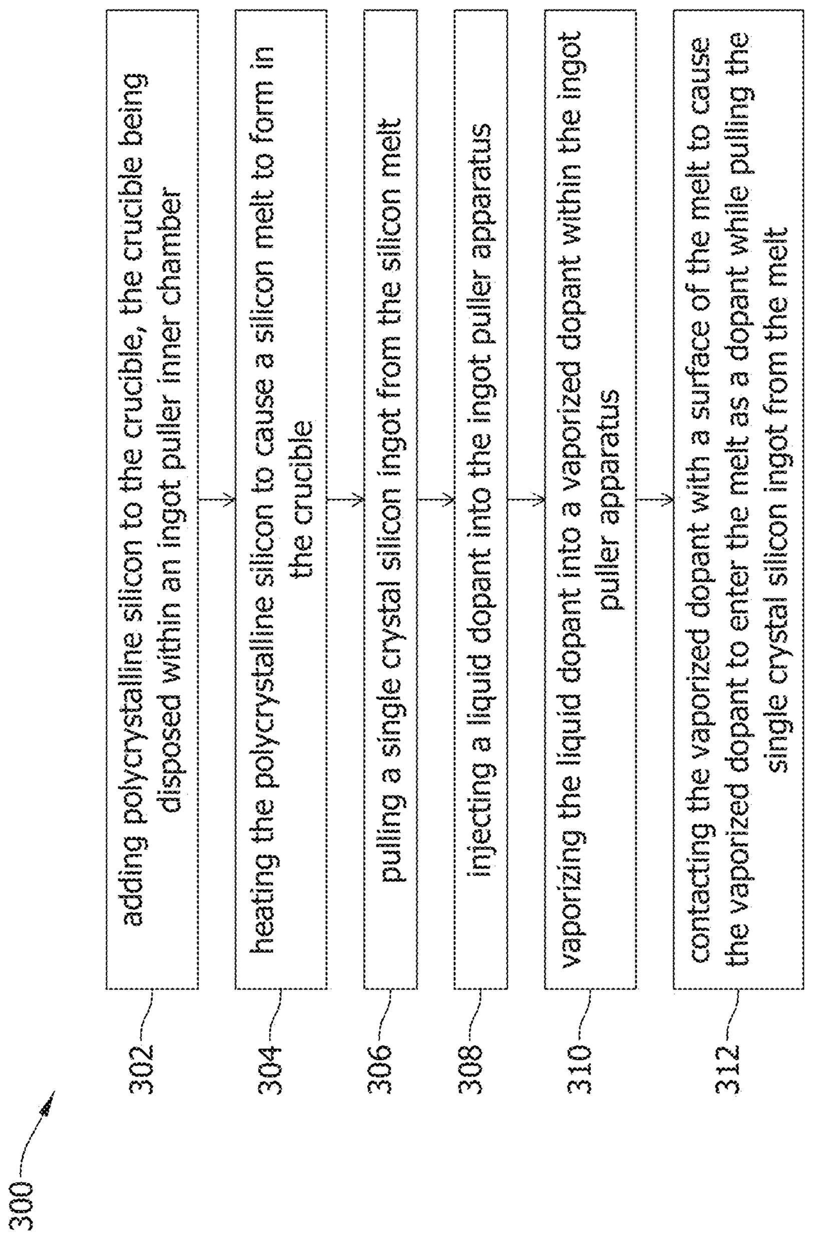
FIG. 9 is a schematic of an example method of producing a single crystal silicon ingot.
Figure 10:
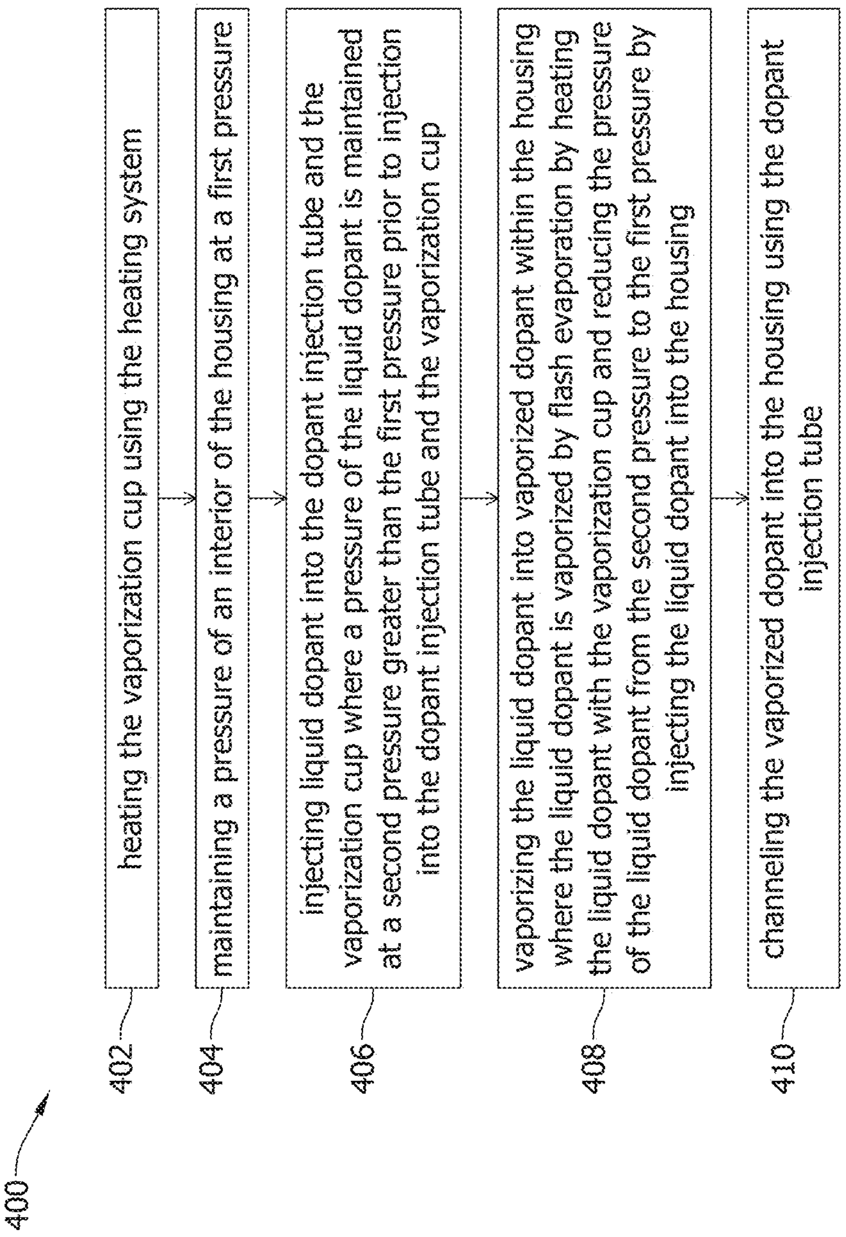
FIG. 10 is a schematic of an example method of doping a single crystal silicon ingot.

Example methods of the present disclosure are shown in FIGS. 9 and 10. The method may be carried out by use of the ingot puller apparatus 100 that is configured to produce a boron-containing gas from liquid-phase boric acid. While the method may be described with reference to the ingot puller apparatus 100 shown in FIGS. 1-8 to exemplify the method, the method should not be limited to the ingot puller apparatus 100 unless stated otherwise.

With reference to FIG. 8, in accordance with embodiments of the method for preparing a silicon ingot, a silicon melt is prepared in the crucible 106 disposed within the ingot puller inner chamber 104 of the ingot puller apparatus 100. The crucible 106 may be supported by a susceptor (not shown). The ingot puller apparatus 100 may be configured to rotate the crucible 106 and/or move the crucible 106 vertically within the ingot puller apparatus 100.

To prepare the silicon melt, polycrystalline silicon is added to the crucible 106. The polycrystalline silicon is heated to above the melting temperature of silicon (about 1414° C.) to cause the polycrystalline silicon to liquefy into the silicon melt 108. The heating system 176 is operated to melt-down the polycrystalline silicon. For example, one or more heaters 200 below or to the side of the crucible 106 are operated to melt-down the silicon.

Before or after the melt 108 is produced, the melt may be doped with a dopant, typically an n-type dopant, to compensate for p-type impurities (e.g., boron) in the melt. The n-type dopant may be added before growth of the ingot 110 commences. By compensating the melt, the resistivity of the resulting ingot 110 may be increased. For example, the seed end of the ingot (i.e., the portion of the ingot nearest the ingot crown) may have a resistivity of at least about 30 Ω-cm or, as in other embodiments, at least about 35 Ω-cm, at least about 40 Ω-cm, at least about 45 Ω-cm, at least about 50 Ω-cm, at least about 55 Ω-cm, at least about 60 Ω-cm or from about 30 Ω-cm to about 60 ohm-cm. Suitable n-type dopants include phosphorous and arsenic.

Once the melt 108 is prepared, the single crystal silicon ingot 110 is pulled from the melt 108. A seed crystal 202 is secured to a seed chuck 204. The seed chuck 204 and seed crystal 202 are lowered until the seed crystal 202 contacts the surface of the silicon melt 108. Once the seed crystal 202 begins to melt, a pulling mechanism slowly raises the seed crystal 202 up to grow the monocrystalline ingot 110. A process gas (e.g., argon) is circulated through the ingot puller inner chamber 104 of the ingot puller apparatus 100. The process gas creates an atmosphere within the ingot puller inner chamber 104.

Embodiments of methods of the present disclosure include providing a source of liquid-phase boric acid ($H_3BO_3$). The boric acid may be relatively pure such as about 99% pure or more, 99.9% pure or more, or 99.99% pure or more. In some embodiments, the boric acid may be relatively isotopically pure (i.e., boron-11).

A boron-containing gas is produced from the liquid-phase boric acid. The gas that is produced is generally in the form of boric acid ($H_3BO_3$) or derivatives thereof ($B_xO_yH_z^+$ complexes) and not other compounds (e.g., diborane ($B_2H_6$) or boron dihydride ($BH_2$)). However, it should be understood that other boron compounds may be added to the boron-containing gas.

The liquid-phase boric acid may be heated to above its vaporization temperature (about 300° C.) to produce a boron-containing gas. For example, the liquid-phase boric acid may be heated by heat radiated from the silicon melt 108 in the ingot puller apparatus 100 or by the heating system 176.

Once the boron-containing gas is produced, the boron-containing gas contacts the surface of the silicon melt 108 to allow boron to diffuse into the melt. Once boron enters the melt, boron compensates for phosphorous which has concentrated in the melt due to the relatively low segregation coefficient of phosphorous, thereby increasing the resistivity of the remaining portion of the ingot 110 that forms in the ingot puller apparatus 100.

FIG. 8 is a graph 206 of ingot resistivity as a function of ingot length. As shown in FIG. 8, the silicon melt 108 may be counter-doped as described herein multiple times as the ingot 110 is pulled from the silicon melt. Specifically, the resistivity of the ingot 110 may decrease as the ingot is pulled from the silicon melt 108 because of the concentration of phosphorous. The silicon melt 108 may be counter-doped with the dopant injector 114 as described herein multiple times as the ingot 110 is pulled from the silicon melt 108 to increase the resistivity of the ingot during production such that a larger portion of the ingot is within customer specifications (e.g., high resistivity). More specifically, as shown in FIG. 8, the silicon melt 108 is counter-doped twice as the ingot 110 is pulled from the silicon melt 108. Accordingly, the dopant injector 114 increases the efficiency of the ingot puller apparatus 100 by counter-doping the silicon melt 108 multiple times during production of the ingot 110 and maintaining the resistivity of a larger portion of the ingot within customer specifications (e.g., high resistivity).

FIG. 9 is a flow diagram of a method 300 for producing a single crystal silicon ingot from a silicon melt held within a crucible positioned within an ingot puller apparatus. The method 300 includes adding 302 polycrystalline silicon to the crucible, and the crucible is disposed within an ingot puller inner chamber. The method 300 also includes heating 304 the polycrystalline silicon to cause a silicon melt to form in the crucible. The method 300 further includes pulling 306 a single crystal silicon ingot from the silicon melt. The method 300 also includes injecting 308 a liquid dopant into the ingot puller apparatus. The method 300 further includes vaporizing 310 the liquid dopant into a vaporized dopant within the ingot puller apparatus. The method 300 also includes contacting 312 the vaporized dopant with a surface of the melt to cause the vaporized dopant to enter the melt as a dopant while pulling the single crystal silicon ingot from the melt.

FIG. 10 is a flow diagram of a method 400 for doping a single crystal silicon ingot pulled from a silicon melt held within a crucible positioned within an ingot puller apparatus. The ingot puller apparatus includes a housing, a dopant injector extending into the housing, and a heating system positioned with the housing. The dopant injector includes a dopant injection tube positioned within the housing and a vaporization cup positioned within the dopant injection tube and the housing. The method 400 includes heating 402 the vaporization cup using the heating system. The method 400 also includes maintaining 404 a pressure of an interior of the housing at a first pressure. The method 400 further includes injecting 406 liquid dopant into the dopant injection tube and the vaporization cup. A pressure of the liquid dopant is maintained at a second pressure greater than the first pressure prior to injection into the dopant injection tube and the vaporization cup. The method 400 also includes vaporizing 408 the liquid dopant into vaporized dopant within the housing. The liquid dopant is vaporized by flash evaporation by heating the liquid dopant with the vaporization cup and reducing the pressure of the liquid dopant from the second pressure to the first pressure by injecting the liquid dopant into the housing. The method 400 further includes channeling 410 the vaporized dopant into the housing using the dopant injection tube.

Compared to conventional methods for producing a single crystal silicon ingot from a silicon melt, the systems and methods of the present disclosure have several advantages. Specifically, a larger portion of the ingot may be within customer specifications (e.g., high resistivity) and/or a type-change in the ingot may be prevented. More specifically, the systems and methods of the present disclosure control the rate of doping such that compensating boron is incorporated into the ingot to neutralize the effect of segregation by phosphorous. Thus, the net free charge carriers may be maintained between limits over the length of the ingot.

Depending on the target resistivity of the ingot, controlling the rate of doping may prevent a type change of the ingot from n-type to p-type or in other examples, from p-type to n-type. Liquid-phase boric acid has a relatively low vaporization temperature which allows a dopant gas to be produced with relative ease. Additionally, the vaporization cup may be placed within ingot puller housing which allows the heat of the melt and the heating system to vaporize the dopant. The feed tube is moveable within the ingot puller apparatus such that the distance from the melt may be controlled which allows the rate of dopant addition to the melt to be controlled. Accordingly, the systems and methods described herein increases the efficiency of the ingot puller apparatus by counter-doping the silicon melt multiple times during production of the ingot and maintaining the resistivity of a larger portion of the ingot within customer specifications (e.g., high resistivity).

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment (s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for producing a single crystal silicon ingot, the method comprising:

adding polycrystalline silicon to a crucible disposed within a chamber defined by a housing of an ingot puller apparatus;

maintaining the chamber at a first pressure;

heating the chamber using radiant heat to melt the polycrystalline silicon and form a silicon melt in the crucible;

pulling a single crystal silicon ingot from the silicon melt;

channeling a liquid dopant at a second pressure greater than the first pressure into a feed tube positioned in the chamber;

vaporizing the liquid dopant into a vaporized dopant by flash evaporation at the first pressure within the feed tube; and directing the vaporized dopant from the feed tube toward a surface of the silicon melt to cause the vaporized dopant to enter the silicon melt as a dopant while pulling the single crystal silicon ingot from the silicon melt.

2. The method of claim 1, further comprising selectively channeling the liquid dopant to the feed tube from a reservoir containing the liquid dopant at the second pressure.

3. The method of claim 2, further comprising supplying a cooling fluid to a cooling jacket that circumscribes the reservoir to cool the reservoir.

4. The method of claim 1, wherein the first pressure is below atmospheric pressure.

5. The method of claim 4, wherein the second pressure is atmospheric pressure.

6. The method of claim 1, wherein the liquid dopant comprises liquid-phase boric acid.

7. The method of claim 1, wherein vaporizing the liquid dopant into the vaporized dopant within the feed tube comprises heating the liquid dopant using a vaporization cup positioned within the feed tube and the chamber.

8. The method of claim 7, wherein directing the vaporized dopant from the feed tube toward a surface of the silicon melt comprises channeling dopant the vaporized through vaporization channels of the vaporization cup and through a distal end of the feed tube toward the surface of the silicon melt.

9. The method of claim 8, further comprising lowering the feed tube to position the distal end of the feed tube proximate the surface of the silicon melt.

10. The method of claim 7, further comprising heat the vaporization cup using the radiant heat.

11. The method of claim 1, further comprising channeling an inert gas into the feed tube, wherein the inert gas facilitates directing the vaporized dopant from the feed tube toward the surface of the silicon melt.

12. The method of claim 1, further comprising diffusing the vaporized dopant into the silicon melt.

13. The method of claim 1, wherein channeling the liquid dopant into the feed tube, vaporizing the liquid dopant into the vaporized dopant, and directing the vaporized dopant from the feed tube toward the surface of the silicon melt are repeated one or more times during pulling the single crystal silicon ingot from the silicon melt.

14. The method of claim 1, wherein channeling the liquid dopant into the feed tube comprises:

channeling the liquid dopant from a first reservoir to a second reservoir by opening a first valve; and channeling the liquid dopant from the second reservoir into the feed tube by opening a second valve.

15. The method of claim 14, wherein the first and second reservoirs are each at the second pressure.

16. The method of claim 15, further comprising maintaining the liquid dopant in the second reservoir before channeling the liquid dopant into the feed tube.

* * * * *